United States Patent [19]
May et al.

[11] Patent Number: 5,587,820
[45] Date of Patent: Dec. 24, 1996

[54] INTEGRATED ELECTRO-OPTICAL LIQUID CRYSTAL DEVICE AND METHOD OF USING SUCH A DEVICE

[75] Inventors: Paul May, Cambridge; Craig Tombling, Oxfordshire; Michael G. Robinson, Oxfordshire; Edward P. Raynes, Oxfordshire; Jonathan Harrold, Oxfordshire, all of United Kingdom

[73] Assignee: Sharp Kabushiki Kaisha, Osaka, Japan

[21] Appl. No.: 310,671

[22] Filed: Sep. 22, 1994

[30] Foreign Application Priority Data

Sep. 23, 1993 [GB] United Kingdom ............ 9319614
Jun. 7, 1994 [GB] United Kingdom ............ 9411330

[51] Int. Cl.$^6$ ............ G02F 1/1343; G02F 1/135; G02F 1/137; H01J 40/14
[52] U.S. Cl. ............ 359/72; 252/221; 252/548; 349/182
[58] Field of Search ............ 359/58, 72, 84, 359/85, 103; 250/221, 548

[56] References Cited

U.S. PATENT DOCUMENTS

| | | | |
|---|---|---|---|
| 3,551,026 | 12/1970 | Heilmeier | 359/48 |
| 4,538,884 | 9/1985 | Masaki | 359/84 |
| 4,790,632 | 12/1988 | Miyakawa et al. | 350/347 V |
| 4,798,448 | 1/1989 | van Raalte | 350/345 |
| 4,904,056 | 2/1990 | Castleberry | 359/54 |
| 5,177,628 | 1/1993 | Moddel | 359/72 |
| 5,227,902 | 7/1993 | Takanaski et al. | 359/72 |
| 5,331,149 | 7/1994 | Spitzer et al. | 250/221 |
| 5,381,210 | 1/1995 | Hagiwara | 250/548 |
| 5,445,763 | 8/1995 | Schlosser et al. | 359/103 |

FOREIGN PATENT DOCUMENTS

| | | |
|---|---|---|
| 0405815 | 1/1991 | European Pat. Off. |
| 2216280 | 10/1989 | United Kingdom |
| 2227853 | 6/1990 | United Kingdom |

OTHER PUBLICATIONS

Search Report for European Appl. 94306897.3, Mailed Oct. 25, 1995.

Mao et al, Applied Optics 31(1992) 10 Jul., No. 20, N.V., "Applications of Binary & Analog Hydrogenated Amorphous Silicon/Ferroelectric . . ." pp. 3908–3916.

Hashimoto et al, 2334c IEICE Transactions on Electronics, E75-C(1992) Nov., No. 11, JP, pp. 1395–1398, "Thresholding Characteristics of an Optically . . .".

Search Report for U.K. Appl. GB 9411330.5, mailed Aug. 3, 1994.

Vass et al, "The Design of Smart SLMs and Applications for Optical Systems," Applied Optics and Optoelectronics Conference, U.K. 1990, pp. 65–66.

*Primary Examiner*—Wael Fahmy
*Assistant Examiner*—Fetsum Abraham

[57] ABSTRACT

An integrated electro-optical device according to the invention comprises a pixellated liquid crystal modulation layer superimposed over an electronic detection layer. Modulator pads for the liquid crystal layer may be formed as electrically conductive combs to achieve optical polarization. Where the liquid crystal layer provides selective absorption of unpolarized light, and separate polarizers between the liquid crystal and detection layers are therefore unnecessary, the device comprises such a liquid crystal layer superimposed over the electronic detector layer. Further, an integrated electro-optical device, optionally of the above type, has a plurality of pixels of the liquid crystal layer for each pixel of the detector array. This allows optical shuttering of the detector pixels by electrically modulating the pixellated liquid crystal layer.

38 Claims, 4 Drawing Sheets

INTEGRATED ELECTRO-OPTICAL LIQUID CRYSTAL DEVICE AND METHOD OF USING SUCH A DEVICE

This invention relates to an integrated electro-optical device and to methods of using such a device. Such a device may be used for image processing such as dynamic optical filtering, optionally with a nonvolatile memory, of an optical image, pattern recognition, and optical processing.

Liquid crystal layers are well known as optical modulators, controlled by an adjacent electronic backplane. Typically, ferroelectric liquid crystal cells are used, and silicon or gallium arsenide backplanes. The parallel input/output capability of such an optical modulator is realised by providing local electronic processing on the same integrated circuit: an image can be read into the electronic backplane through the transparent liquid crystal, thresholded, and then recorded in the liquid crystal by the application of suitable voltages to pixellated modulator pads. The thresholded image can then be read in parallel by a read beam which is transmitted through the liquid crystal and reflected from the backplane. Such an arrangement is disclosed in "The design of smart SIMs and applications in optical systems", D. Vass etal, Applied Optics and O-E Conf, Nottingham [1990].

GB 2 227 853 and GB 2 216 280 disclose a spatial light modulator having a photoconductor which may be amorphous silicon. The photoconductor is separated from a nematic liquid crystal by a mirror which separates the read and write beams and reduces the effect of the read beam on the photoconductor. The photoconductor is used only for optically writing data into the spatial light modulator.

GB 5 227 902 discloses an arrangement in which a liquid crystal spatial light modulator is disposed between two photoconductive layers. The photoconductive layers are used only for optically writing data into the spatial light modulator from opposite sides of the arrangement.

Most liquid crystal materials require an element to analyse the polarisation state of the light in order to achieve optical modulation, and devices of the type described above are unable to read directly onto the electronic backplane the image which has been stored in the liquid crystal.

According to the invention, there is provided a device as defined in the appended claim 1.

Preferred embodiments of the invention are defined in the other appended claims.

By providing an integrated polarising element between the liquid crystal layer and the electronic detection layer, it is now possible to process the image in the plane of the liquid crystal, whilst maintaining the advantages of stability, size and resolution in an integrated device. For example, the device can be used as a novelty filter, by storing a first image in the liquid crystal layer and using it to modulate a second image transmitted through that layer and detecting the emergent light in the detector plane.

Liquid crystal devices which incorporate anisotropic dyes in the liquid crystal, also called guest-host pleochroic dyes, allow the liquid crystal layer also to function as a polariser. We have discovered that such liquid crystal materials can be used to achieve direct imaging in a similar way, and accordingly the invention also provides an integrated electro-optical device comprising a pixellated liquid crystal layer whose pixels are responsive to electric control signals to vary their absorption of polarised light, and a superposed electronic detector layer.

A further problem with currently-available integrated light-modulation devices is the inflexibility of the optical link between an object and the detector array of the device: the spatial resolution of the device has to be predetermined.

It is possible to provide an integrated electro-optical device comprising a pixellated liquid crystal optical modulation layer over a pixellated opto-electronic detector array, in which there is a plurality of pixels of the liquid crystal layer for each pixel of the detector array. As described by way of example below, this enables the liquid crystal layer effectively to act as a shutter for the detector array, and an arrangement such as this has a wealth of useful applications. The device may be used in a method of detecting the positions of edges in an object, and it may be used in a method of detecting motion of an object. Further applications of a device according to this aspect of the invention are disclosed and claimed in our co-pending British Patent Application No. 9319619.4.

In another embodiment of the present invention, there is provided an array of lenses, the detection layer comprises an array of photodetectors, and at least one photodetector is arranged to receive light from a respective lens via the optical modulation layer and the absorbing means.

It is thus possible to provide a device which allows the storage of images in a liquid crystal by electro-optic means and which also allows parallel detection of images that have been modulated by the or each image stored in the liquid crystal.

Each lens may be associated with a respective photodetector and the liquid crystal optical modulation layer adjacent each photodetector may be arranged to store a multi-pixel image. Thus a filter image is stored for each of the individual detectors of the detector array associated with a lens. The combination of the array of photodetectors and the parallel update of the filter images allows for fast, self aligned storage and processing of images. It is thus possible to provide an inexpensive device having high resolution.

Preferably the photodetectors are formed of semiconductor. Suitable semiconductors include amorphous silicon, crystalline silicon, gallium arsenide, and mixtures of semiconductors. Preferably the photodetectors are associated with, or function as, photoconductors.

The invention will be further described, by way of example only, with reference to the accompanying diagrammatic drawings, in which:

FIG. 5b represents the wiring diagram of a perfectly-formed integrated circuit corresponding to that of FIG. 5a;

Figure 1:
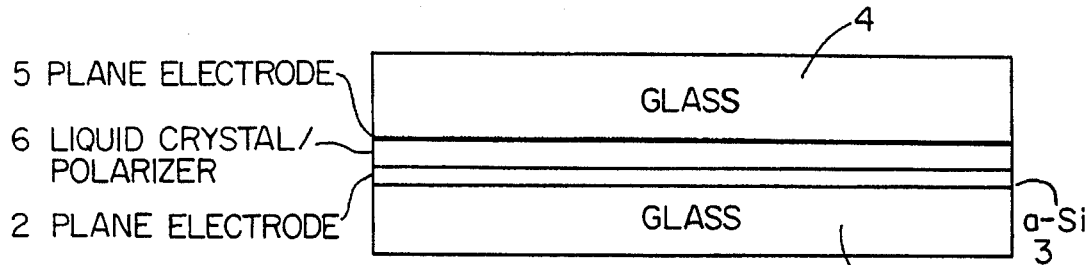
FIG. 1 is a cross-sectional view of an integrated electro-optical device constituting a first embodiment of the invention.

The integrated electro-optical device shown in FIG. 1 comprises a glass substrate 1 on which is formed a transparent plane electrode 2, for instance of indium tin oxide (ITO). A layer 3 of amorphous silicon is formed on the electrode 2 and constitutes an unpixellated detector layer. A further glass substrate 4 has formed thereon another transparent plane electrode 5 of ITO. A combined liquid crystal and polariser 6 is enclosed between the electrode 5 and the amorphous silicon layer 3 and comprises a ferroelectric liquid crystal (FLC) incorporating a pleochroic dye. The anisotropic dyes dissolved in the liquid crystal ("guest-host liquid crystal layer") have polarisation dependent absorptions and act as an integrated analysing element. Such FLC devices can typically achieve an on-off contrast ratio to polarised light of 10:1.

The device shown in FIG. 1 may be used as an optical novelty filter. Light spatially modulated with an image to be stored in the FLC is directed through the glass substrate 1 and the electrode 2 onto the amorphous silicon layer 3. The amorphous silicon creates a charge carrier pattern corresponding to the image and, by applying a suitable potential difference across the electrodes 2 and 5, charges are injected into the FLC so that a non-volatile image corresponding to the image to be stored is stored in the FLC.

Light spatially modulated with an image to be filtered is directed through the substrate 4 and the electrode 5. For correct operation, the light is required to be suitably polarised and this may be achieved by passing the spatially modulated light through a polariser (not shown) located above the substrate 4. The image to be filtered is filtered by the image stored in the FLC and differences between the images may be detected quantitatively by monitoring the current flowing across the amorphous silicon layer 3 when a suitable potential difference is applied across the electrodes 2 and 5 with an amplitude or frequency or both such as not to alter the image stored in the FLC.

The image stored in the FLC is the optical inverse of a filtering image with respect to which novelty is to be detected. Thus, light or transparent regions of the stored image correspond to dark or opaque regions of the filtering image. The amorphous silicon layer 3 thus receives light only in those regions where the image to be filtered is light and the filtering image is dark. In order to detect changes from light to dark, both images may be inverted and the process repeated. The device therefore detects differences or changes between the images.

The position of single changes can be detected by providing separate "X" and "Y" electrodes attached to the amorphous silicon layer 3, where the ratio of the current received by the two electrodes indicates the position of the change. Position detection of multiple changes may be achieved by providing a degree of pixellation of the amorphous silicon layer 3.

Figure 2:
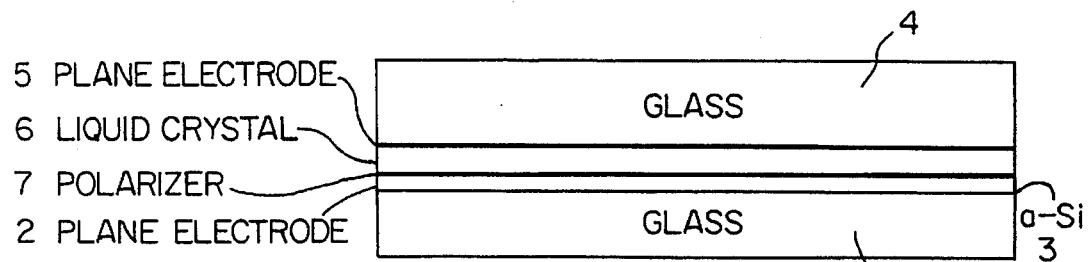
FIG. 2 is a cross-sectional view of a device constituting a second embodiment of the invention.

The device shown in FIG. 2 differs from that shown in FIG. 1 in that, instead of using a pleochroic dye in the FLC 6 as a polariser, a separate metal polariser 7 is provided between the FLC and the amorphous silicon layer 3. The metal polariser may comprise elongate fingers as described hereinafter.

In order to provide pixellated detection, the devices shown in FIGS. 1 and 2 may be modified by replacing the amorphous silicon layer 3 with a detector array. Such an arrangement has the advantage that the detector array can provide a direct indication of the position of the or each change, while permitting parallel read-in of the image to be stored.

Figure 3:
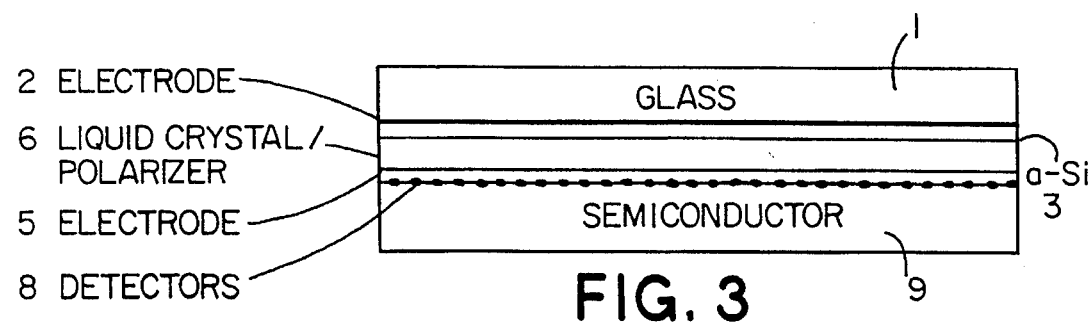
FIG. 3 is a cross-sectional view of a device constituting a third embodiment of the invention.

FIG. 3 shows a device which combines the use of an amorphous silicon layer 3 with a detector array 8, for instance in the form of a charge coupled device (CCD). The device differs from that shown in FIG. 1 in that the glass substrate 4 is replaced by a semiconductor substrate 9 on which is formed the array of detectors 8. The upper surface of the substrate 9 is polarised and the electrode 5 is formed thereon.

In use, the image to be stored is read-in in parallel by means of the amorphous silicon layer 3. The array of detectors 8 then detects changes between the image to be filtered and the filtering image. The detectors 8 are "pixellated" and thus allow the positions of detected changes to be indicated directly.

In many applications of the devices shown in FIGS. 1 to 3, the storage capability is sufficiently long. However, there is a tendency for the stored state within the FLC to decay because of junction potentials between the amorphous silicon 3 and the ITO electrode 2. Also, these devices are asymmetric in response to applied fields, which can make operating the devices somewhat difficult.

Figure 4:
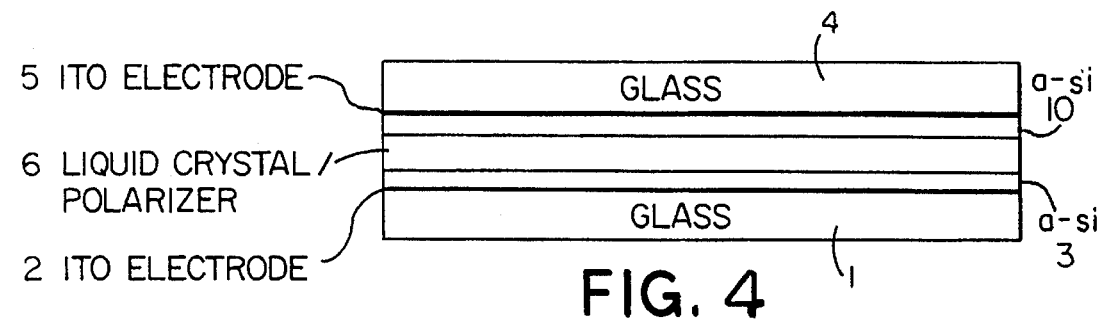
FIG. 4 is a cross-sectional view of a device constituting a fourth embodiment of the invention.

FIG. 4 illustrates a device which is electrically more symmetrical without being optically symmetric. Optical asymmetry is required to provide optical access to the device from one side without severe attenuation. The device shown in FIG. 4 differs from that shown in FIG. 1 in that a thin layer of amorphous silicon 10 is provided between the ITO electrode 5 and the ferroelectric liquid crystal of the layer 6. The thickness of the layer 10 is preferably substantially equal to a quarter wave at the operating wavelength of the device so as to minimise reflections.

By providing a more symmetrical electrical structure, decay in the stored state of the liquid crystal is substantially reduced, thus improving the effective retention time of stored data. Further, because the device is more nearly electrically symmetrical, the driving voltage asymmetry is substantially reduced.

Instead of using the amorphous silicon layer to read-in the image in parallel, other geometries are possible where charge is injected directly from each detecting pixel. For instance, each detector pixel may be associated with a modulating pad whose voltage is varied according to the state of the associated detector pixel. Alternatively, the image may be read-in serially after detection by reading the image data from the detector pixels into a memory and then reading the image into the liquid crystal using a standard electronic matrix addressing scheme. As another alternative, the amorphous silicon layer may be disposed between the liquid crystal/polariser and the detector array. The quantity of change in an image may then be monitored by operating the amorphous silicon in detection mode. Any subsequent read-out of the difference image recorded on the detector array may then be made contingent on the size of the quantity of change, which thus acts as a "trigger" signal.

An application of the use of the "difference image" will now be described with reference to FIGS. 5a–5d. Integrated circuits need to be tested for faults, for instance by comparison with a perfect integrated circuit or chip. This example of chip testing is a specific case of the more general application of the comparison process, where faults or changes in a well-defined scene are detected. Rapid visual inspection of the complex metal pattern on a particular layer of a VLSI chip is required, with high spatial resolution, for example to 50 microns.

Figure 5A:
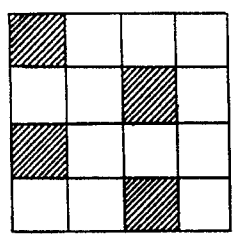
FIG. 5a represents the wiring pattern of an integrated circuit under test.
Figure 5B:
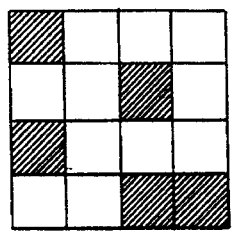
Figure 5C:
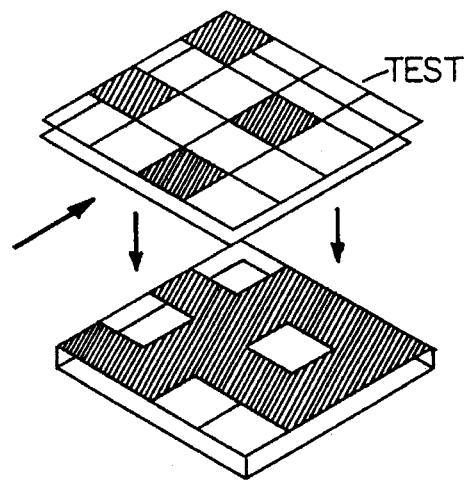
FIG. 5c represents the use of a device embodying the invention to compare the perfect and test integrated circuits.
Figure 5D:
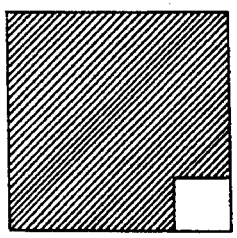
FIG. 5d represents the difference image produced by the device embodying the invention during the process represented in FIG. 5c.

A small region of a chip to be tested is shown in FIG. 5a, in which dark areas represent the presence of metal. The corresponding region of a perfect chip is shown in FIG. 5b. The purpose of the inspection is to test for short circuits, caused by an excess of metal, or open circuits, caused by a lack of metal. In this particular case, there is an open circuit in the bottom right square. For angled illumination of the chip, i.e. dark field illumination, a short circuit is identifiable as a dark pixel, and an open circuit as a light pixel, each pixel corresponding to a square of the region shown. The image data corresponding to the perfect chip of FIG. 5b are inverted and either loaded electrically or read-in optically and stored in the FLC, as shown in FIG. 5c. The chip under test is illuminated to produce an optical beam represented as "TEST" in FIG. 5c, aligned with the stored image on the FLC. Thus the test image is pre-processed in the FLC by the stored inverted perfect image, and the optical beam emerging represents the difference image, for detection by the CCD layer. If the chip under test were perfect, then no signal would be received by the detector layer. However, in this example, the open circuit causes an unusual bright pixel, shown in FIG. 5d, which is detected by the detector layer. The presence of this bright pixel is detectable, as is its address.

Other operations may be performed depending on the exact geometry of the novelty filter. For instance, for a device having amorphous silicon between the liquid crystal and the detector array, the "size" of the difference can be monitored before deciding whether to read-out a difference image.

Electrical short circuits are not detected, however, as the FLC plane acts as a blocking plane for areas where there is no metal in the perfect chip. Accordingly, the process is repeated in a second cycle, using bright field illumination of the test chip, with the stored image inverted, to provide the necessary information for electrical short circuits. Clearly, this type of testing under conditions of strict spatial, size and orientation constraints can be extended to other areas of interest.

Figure 6:
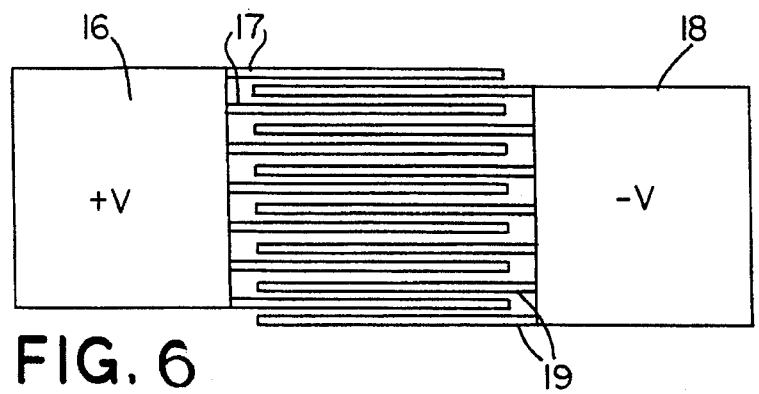
FIG. 6 represents one modulator pad/pixel of a combined detector and polariser array of another embodiment of the invention.

In a further embodiment now to be described with reference to FIG. 6, the polariser/electrode layer is combined in the same plane as the detector layer. This combined layer is an interdigitated metal-semiconductor-metal detector layer (IMSM), in which the photosensitive semiconductor portions replace the regular diodes, of the CCD structure described above. One pixel of this layer is shown in FIG. 6, and consists of counter electrodes 16 and 18 connected respectively to elongate conductors 17 and 19 which are parallel and interdigitated. The comb structure of the interdigitated conductors constitutes an optical polariser and an electrical modulator pad for the liquid crystal layer to which it is adjacent. The voltages +V and −V on each pixel are varied according to its intended use.

When an image is being read, voltages are applied across the electrodes 16, 18 of each pixel which is addressed: the pixels may be addressed in series, to achieve shuttering, or in parallel. When a voltage is applied across the electrodes, photogenerated carriers are collected at each electrode to generate a current. Once the image has been detected, an appropriate voltage is applied to both electrodes 16, 18 of the detector, which then acts instead as a modulator pad, with a uniform electrical potential on the elements 17, 19 of the comb. The FLC and IMSM arrays then act as a novelty filter as described above, with the metal fingers acting as an optical polariser. Any difference image data can be obtained, for example by clocking the data from the pixels of the detector array, using conventional techniques.

All of the devices described above can be used for motion detection, using the device as a camera which records only changes in a scene. This is useful for compressing information to meet constraints of a limited bandwidth for communications purposes, or storage constraints particularly if the stored time sequence has to be reviewed at a later time. The devices can also be used to detect the location of edges in an object, since edges represent the positions at which an image changes from dark to light or light to dark.

Figure 7:
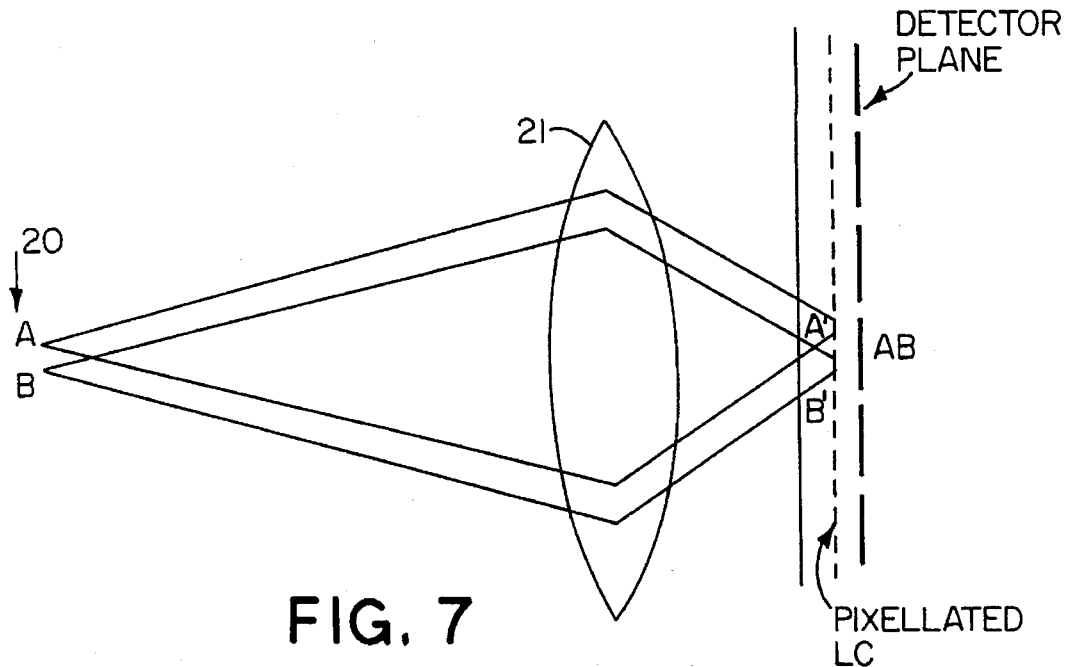
FIG. 7 represents the optical arrangement for detecting the position of edges in an object using a further embodiment of the invention.

Edge detection apparatus is shown in FIG. 7, which represents another embodiment of the invention. In this example, there is no longer a 1:1 correspondence between the pixels of the liquid crystal array and the pixels of the detector array. In this particular example, there are two liquid crystal pixels adjacent every detector pixel, thus doubling the number of liquid crystal pixels in one dimension. In an alternative example, there are four liquid crystal pixels for each detector pixel, so that the number is doubled in both rows and columns. Since the liquid crystal pixels are separately controllable to modulate their transmissivity, it is possible effectively to shutter i.e. to alternative dynamically, the optical beam which reaches each individual pixel of the detector plane, as shown in FIG. 7 in the case of two pixels A' and B' adjacent a single detector pixel AB.

Adjacent points A and B of an object 20 in the far field are brought by a lens 21 to focus on the same detector element AB, but through different modulating pixels A' and B'. First the input scene is recorded on the detector plane with only the upper pixel of each pixel pair in a transmitting state and the lower pixels attenuating. This would record part A of the object 20 on the detector element AB. This first image is then applied electronically to the modulator pads for the lower pixel of each pixel pair, so that this lower group of pixels will act as a pre-processing plane, modulated with the first image. With the upper pixel group acting as a shutter, in the attenuating state, the same object 20 is imaged again; the portion B would be imaged through pixel B' of the liquid crystal array. The difference image then reaches the pixels of the detector array. Thus it is only where adjacent points A and B are different that there would be a corresponding signal from the relevant pixel of the detector array. The information teaching the detector array is therefore due solely to points of the input scene 20 which are adjacent and are different from the original input, i.e. the detector array receives only edge information. In order to detect all the edges, a second cycle of this process would be necessary, in order to detect changes in the opposite sense (dark to light edges instead of light to dark edges, for example).

Devices similar to that of FIG. 7 can be used in a wide range of optical shuttering applications. High speed shuttering of an underlying sensor array such as a CCD is possible, and is described more fully in our co-pending patent application referred to above. Super resolution shuttering is possible, in which there may be larger numbers of liquid crystal pixels for each detector pixel, the number being determined, in relation to the available switching speed, in accordance with a trade-off between spatial and temporal multiplexing. In this way, the resolution of the image can be adjusted quickly according to time-varying requirements of this optical system. As also described in, our co-pending patent application, the use of microlens arrays integrated with the electro-optical device increases the sensitivity of the device by concentrating incoming light onto the detector areas.

In the devices described above, the liquid crystal array is of FLC, mainly because of its advantages of non-volatility. However, some applications do not require non-volatility, and liquid crystals of more conventional structure can be used, for shuttering or for other applications.

Devices embodying the invention can be used for image processing in constrained geometries, for example in visual testing as part of quality control in manufacturing processes; security recognition devices; novelty filtering for image compression for example for video telephony; and professional video applications where high speed shuttering and variable resolution are useful.

Figure 8A:
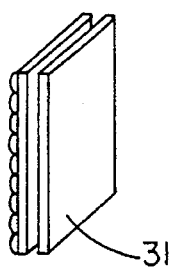
FIG. 8 is a schematic diagram of a device constituting a fifth embodiment of the present invention.
Figure 8B:
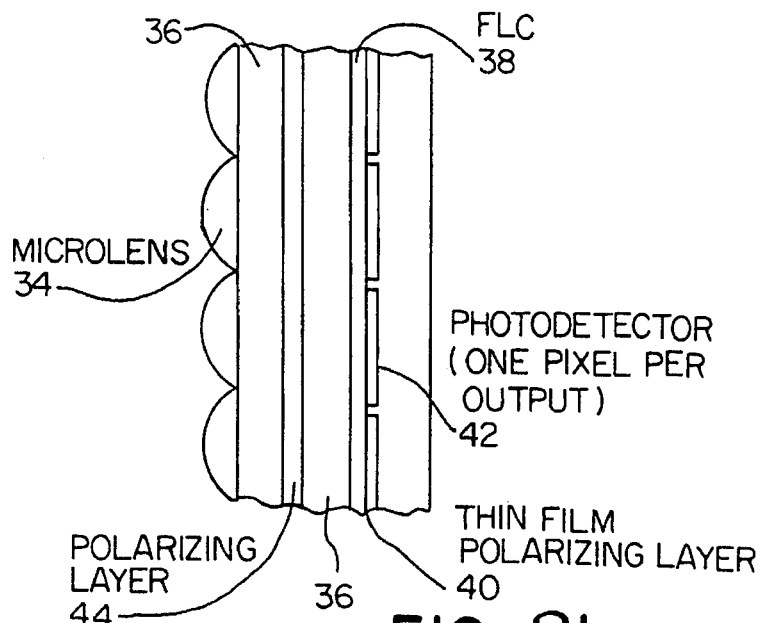

The electro-optical device shown in FIG. 8 is formed on one surface of an integrated device 31 carrying processing electronics, for instance comprising an integrated circuit having addressing electronics for accessing the outputs of individual photodetectors. The structure of the electro-optic device is shown in more detail in the encircled region of FIG. 8. An array of microlenses 34 is formed on a first surface of a glass substrate 36. A layer of ferroelectric liquid crystal 38 is contained between a second side of the glass substrate 36 and a polariser 40 positioned adjacent an array of photodetectors 42, each of which comprises photoconducting material. The polariser 40 may, for instance, comprise a metallised grating, a liquid crystal aligned polymer or a cholesteric liquid crystal material. In the embodiment shown in FIG. 8, a polarising layer 44 is provided within the substrate 36. However, in other embodiments, the layer 44 may be omitted from the device and a separate polariser may be disposed in front of the array of microlenses 34.

The size of the device is governed by the resolution of the storage mechanism for the ferroelectric liquid crystal (FLC). The resolution is in turn dependent upon the properties of the photoconducting material used in the photodetectors. For a photodetector comprising amorphous silicon, the smallest feature sizes within the FLC layer for modulating light passing therethrough are typically 20 μm. For an input image resolution of 100×100 elements, the size of each photodetector (associated with an individual microlens) in the array is therefore approximately 2000 μm. For a device made of silicon, a device size of approximately 5 cm square is feasible, thereby allowing an array of 25×25 photodetectors to be made on a single device.

The device can operate at very great speed. An array of 25×25 detectors has a relatively small number of outputs and thus the information represented thereby, whether it is represented in a binary or analogue form, can be read out very rapidly. The input of the device is asynchronous and it is possible to detect directly an image at each lens 34 of the array in parallel. This allows greater processing rates than can be achieved, for instance, by a system using a charge coupled device input.

Thus, in the example described above, each photodetector has a single output and in effect constitutes a single pixel. However, the filter image stored adjacent a photodetector may have a resolution of 100×100 filter image pixels.

Figure 9:
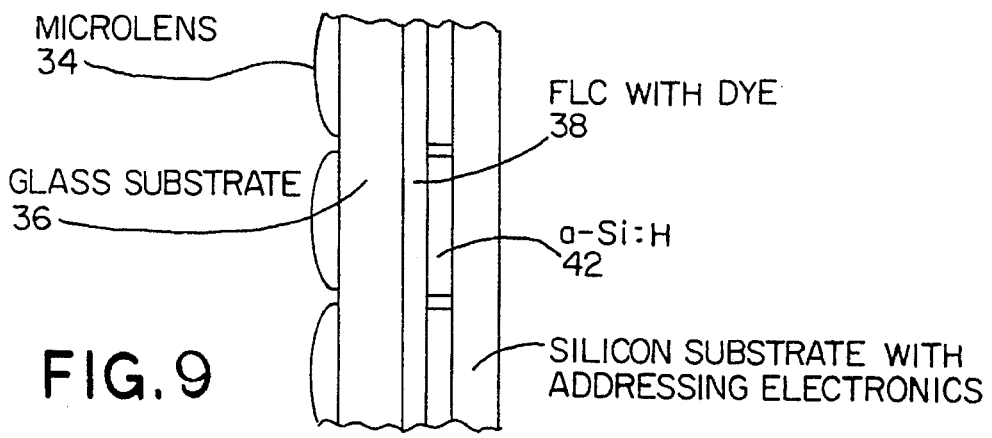
FIG. 9 is a schematic diagram of a device having a dye within the liquid crystal layer and constituting a sixth embodiment of the present invention.
Figure 13:
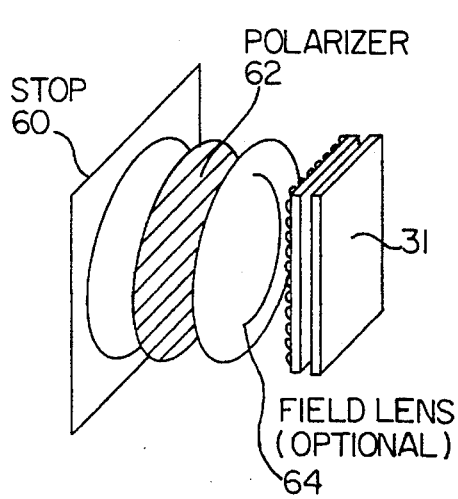
FIG. 13 is a schematic diagram of an optical processing system employing an electro-optical device.

The embodiment shown in FIG. 9 is similar to that shown in FIG. 8, except that the polarising layers 44 and 40 have been omitted and the liquid crystal layer 38 includes a dye which is dichroic to form a "guest-host liquid crystal layer". Orientation of the dye molecules can be controlled by the switching of the FLC. Thus, the FLC/dye combination functions as an electrically controllable macroscopic polariser whose axis of polarisation is determined by the state of the FLC 38. Such FLC devices can typically achieve an on-off contrast ratio of 10:1. The polariser 40 is thus effectively included within the FLC layer 38. The polariser 44 is replaced by an external polariser (as shown in FIG. 13) positioned so as to polarise the light incident on the array of lenses 34

Figure 10:
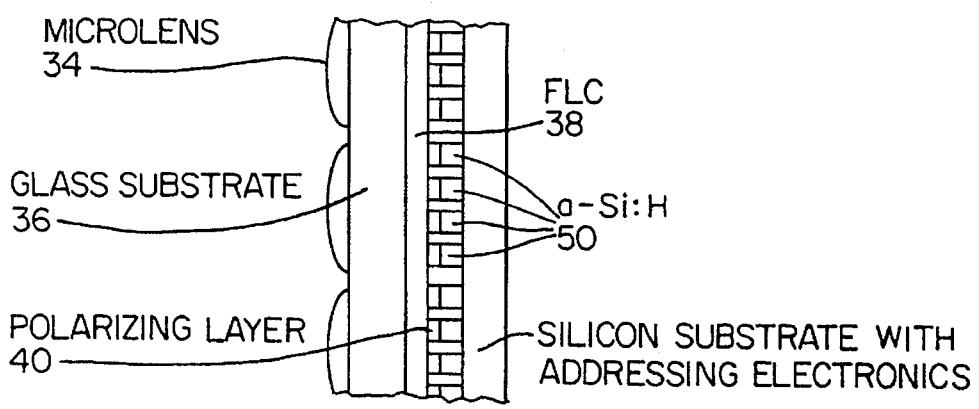
FIG. 10 is a schematic diagram of a device having sub-pixels and constituting an seventh embodiment of the present invention.

FIG. 10 illustrates a further embodiment in which the polarising layer 40 is a metallic grating. The separate pixels of the input image (determined by the resolution of the device and of the optical imaging system) must be electrically isolated to allow independent updating of the filter pixels (i.e. the image held within the region of the FLC layer adjacent each lens 34). Thus the device is pixellated for each image corresponding to each individual microlens and further sub-pixellated, as indicated by the regions 50 which replace each detector 42 shown in FIG. 8 with a sub-array of detectors. The output of the detectors of the sub-array may be summed to simulate a single detector, or may be read individually to distinguish the individual pixels of an image.

In each of the embodiments described hereinabove, gallium arsenide may be substituted for the amorphous silicon which functions both as the photo-addressing material and as the photodetector. To distinguish between the two operations of updating the filter images and reading data from the photodetectors, a temporal multiplexing scheme is employed. A read operation detects the induced photocurrent in a time period which is short compared to the switching time of the FLC.

An example of the operation of the device as a novelty filter will be described. A filter image may be stored in the FLC layer 38 between each lens and the corresponding photodetector. The image for a given lens/photodetector combination may be input optically by directing the filter image through the lens 34 onto the photoconducting material of the photodetector. The photoconductor creates a charge pattern corresponding to the image of the filter. The image can be transferred to the FLC, for instance by applying a suitable potential difference between the photodetector and a transparent electrode (not shown) between the glass substrate and the FLC so as to inject charges into the FLC, so that a non-volatile image corresponding to the filter image is stored in the FLC. Alternatively the filter image may be written electrically if individual image pixels within each photodetector can be individually addressed or if the FLC layer is provided with patterned electrodes such that individual filter image pixels within a plurality of pixels in the FLC layer between a respective lens and photodetector pair can be controlled so as to write a filter image into the FLC 38.

The filter image stored in the FLC modulates subsequent images presented to the given photodetector. If light is transmitted through the filter image, a photocurrent is induced in the photodetector. This can then be measured to indicate the degree of dissimilarity between the filter image and the subsequent image or images. In order to read the result of a comparison of the subsequent image with the filter image held in the FLC layer 38, a bias voltage is applied across the photoconductors such that the photocurrent may be detected. If necessary, the bias is removed before the FLC changes state.

Figure 11:
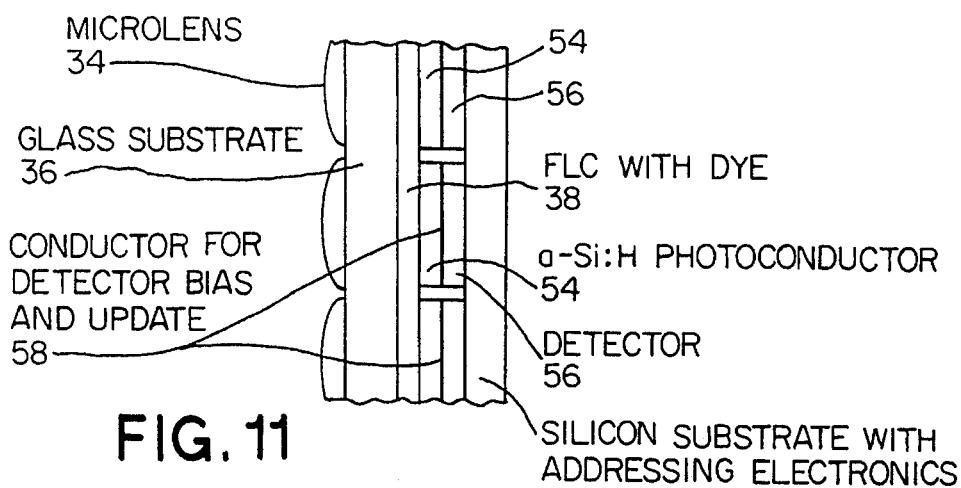
FIG. 11 is a schematic diagram of a device having separate charge injection and detection structures and constituting an eighth embodiment of the present invention.

If the operation of the photoconducting material is ineffective as a photodetector, then the photoconductor and the photodetector can be made separately, as shown in FIG. 11. As with the previously described embodiments, an array of lenses 34 is formed on the first side of the glass substrate 36 and the second side of the glass substrate 36 is in contact with a first side of a layer 38 of FLC, for instance containing a pleochroic dye. The second side of the FLC layer 38 is in contact with an array of photoconductors 54. The photoconductors 54 are in close proximity to respective photodetectors 56 and sandwich respective conductors 58 at the interfaces between the photoconductors 54 and the respective photodetectors 56. The photodetectors 56 are formed on a first surface of a semiconductor substrate having addressing electronics integrated therein.

Thus the operation of the photoconductor to update the filter image held in the FLC layer 38 is separate from the operation of the photodetector.

The embodiment shown in FIG. 11 may be modified by removing the dye from the FLC layer and introducing a polariser, equivalent to the polariser 40 show in FIG. 8. Additionally or alternatively, a polarisation sensitive detector, such as a metal-semiconductor-metal (MSM) detector having a fine pitch of the type shown in FIG. 6, could be used.

Figure 12:
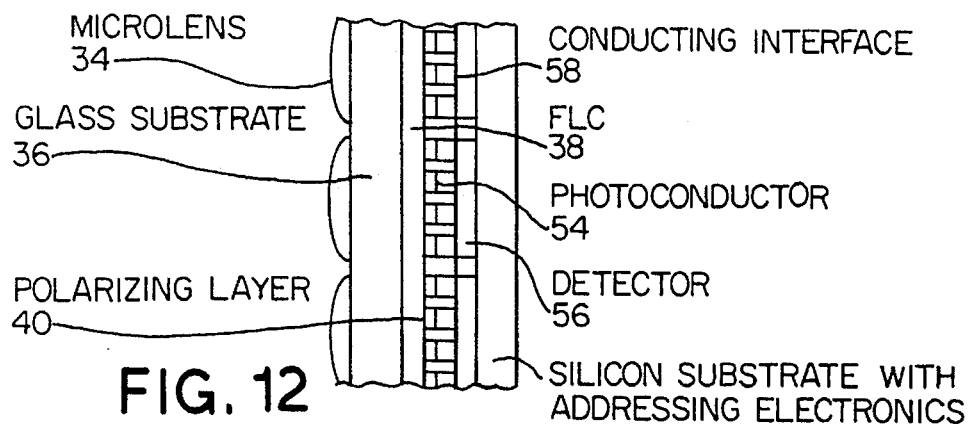
FIG. 12 is a schematic diagram of a device constituting a ninth embodiment of the present invention.

The photoconductor allows for the optical pixellation of the FLC. If sub-pixellation is required, the embodiments shown in FIGS. 10 and 11 can be combined, as shown in FIG. 12, and the signal detected during updating of the detector can be fed back onto an electrode adjacent the detector.

The image processing system shown in FIG. 13 includes an optical stop 60 in the form of an aperture to prevent the images from the microlenses from overlapping. Further, for those embodiments not having a polarising layer 40 within the substrate 36, and for systems not receiving polarised light, an external polariser 62 is provided. If a strict field of view is to be visible to all of the photodetectors on a regular grid, then a field lens 64 is also provided.

The embodiments operate in substantially the same way and may be used to perform data reduction. The FLC layer interposed between each lens and detector pair is used to store a basis image that acts as a filter image. Subsequent images presented to the integrated device 31 can be represented or encoded as linear superpositions with the individual images held by the filters. Thus each filter acts as a novelty filter. The amount of data required to represent a sequence of images can be considerably reduced. The coefficients of the expansion can be directly derived by this device, if the basis images are shared by two parties, then only the coefficients need to be passed between the parties in order to exchange image data. This is especially useful if image data is to be transmitted over a low bandwidth communications link. However, such a scheme does require that the filter information is known by or transmitted between the parties.

If non-specific basis information is shared and the mapping of particular basis images onto the shared ones is carried out by the device, then the specific mapping basis images need only be local and can be input directly via a fast direct input. An example of such a system having local basis images is a fax transmission system having the stored images as a set of letters in a predefined order in a local font, which is arranged to detect the sequence of letters by direct comparison in the image plane and to indicate the detection to a remote terminal which recreates the sequence of letters in a second font used at that terminal.

A further use is for checking for changes in an image, for example using the technique described hereinabove. Several comparisons can be carried out simultaneously, for example for distinguishing something different in a scheme that involves a controlled moving object. The object may be represented by a finite series of images. Rotating objects can be monitored in this manner.

Other applications include robot vision systems, where high resolution is not necessary but on line learning may be required. Also, there may be provided image recognition systems where various different types of object need to be identified, for example so as to determine what operations need to be performed on that object, or to determine if a fault is developing in an object. Furthermore, the filter images may be updated in an incremented fashion allowing the device to act as a neural network processor, for instance for image classification applications.

Figure 14:
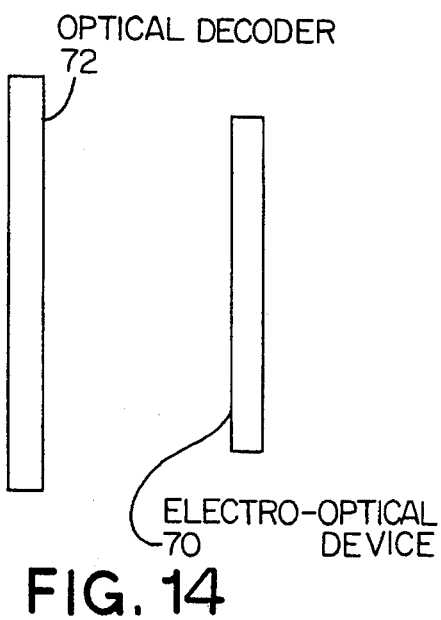
FIG. 14 illustrates an application of an arrangement employing an electro-optical device.

FIG. 14 illustrates an application of an electro-optical device 70, which may comprise any of the devices described hereinbefore, together with an optical decoder 72. The optical decoder 72 is used to detect spatial changes in optical information encoded using any suitable optical encoding, such as colour, optical phase, polarisation, spatial and temporal coherence. For instance, in one form of the system shown in FIG. 14, the optical decoder 72 comprises a colour filter and polariser which allows specific optical spectral bands to be interrogated. Such an arrangement may be used to enhance the contrast of similarly coloured objects within a scene by passing light in a relatively narrow coloured spectral band. For this purpose, the decoder 72 may comprise an optical glass filter having an optical pass band which falls within the band defined by the performance of the polariser which is integral with the device 70. For applications requiring sensitivity to large variations in the optical spectral band of interest, for instance where several different colour filters may selectively be used, the materials within the device 70 are chosen so as to be effective in the relevant spectral bands.

The decoder 72 may comprise any device which encodes information in the form of a spatial distribution of intensity. For instance, the decoder 72 may comprise an optical interferometer such as a Michelson interferometer. Alternatively, the decoder 72 may comprise a retardation element which, when combined with an external polariser, allows complex optical polarisation (other than linear) to be analysed. In another application, the decoder 72 may comprise a micro-optic array for spatially sampling an optical phase front.

What is claimed is:

1. An integrated electro-optical device comprising a liquid crystal optical modulation layer, an opto-electronic detector layer, and means for absorbing polarized light superimposed over the detector layer, the absorbing means forming an integral polarization analyzer and the detector layer being arranged to detect a result of optical processing by the optical modulation layer via the absorbing means.

2. A device according to claim 1, wherein the optical modulation layer is responsive to electric control signals to vary the amount of polarized light incident on the detector layer.

3. A device according to claim 1, wherein the optical modulation layer and the absorbing means are responsive to electric control signals to vary absorption of polarized light.

4. A device according to claim 3, wherein the optical modulation layer and the absorbing means are of a guest-host type using anisotropic dye.

5. A device according to claim 4, wherein the dye is dichroic.

6. A device according to claim 1, wherein the absorbing means is a polarizer and is combined with the detector layer.

7. A device according to claim 6, wherein the combined polarizer and detector layer comprises an array of interdigitated metal-semiconductor-metal detectors.

8. A device according to claim 6, wherein the combined polarizer and detector layer comprises an optical polarizing layer disposed between the optical modulation layer end the detector layer.

9. A device according to claim 8, wherein the polarizer comprises en array of electrodes each of which has electrically conductive elements arranged to effect optional polarization.

10. A device according to claim 1, wherein the detector layer comprises silicon.

11. A device according to claim 10, wherein the silicon is amorphous silicon.

12. A device according to claim 11, wherein the device comprises a further layer comprising amorphous silicon with the optical modulation layer disposed between the detector layer and the further layer comprising amorphous silicon.

13. A device according to claim 1, wherein the detector layer comprises gallium arsenide.

14. A device according to claim 1, wherein the detector layer further comprises a photoconductor.

15. A device according to claim 14, wherein the device comprises means for optically presenting an image to the photoconductor and means for applying a voltage across the optical modulation layer so as to cause a thresholded version of the image to be stored in the optical modulation layer.

16. A device according to claim 1, wherein the device further comprises filter image writing means for writing a filter image into the optical modulation layer.

17. A device according to claim 16, wherein the device further comprises patterned electrodes for pixellating the optical modulation layer.

18. A device according to claim 17, wherein the detector layer comprises an array of photodetectors, the device further comprises an array of lenses, at least one of the photodetectors is arranged to receive light from a respective lens via the optical modulation layer and the absorbing means, and the patterned electrodes define at least one liquid crystal layer pixel disposed adjacent each of the photodetectors.

19. A device according to claim 1, wherein the detector layer comprises an array of photodetectors, the device further comprises an array of lenses, and at least one of the photodetectors is arranged to receive light from a respective lens via the optical modulation layer and the absorbing means.

20. A device according to claim 1, wherein the device comprises an input polarizer for polarizing light incident on the optical modulation layer.

21. A device according to claim 1, wherein the device comprises an aperture and field lens for forming an input image.

22. A device according to claim 1, wherein the liquid crystal of the optical modulation layer is a ferroelectric liquid crystal.

23. A method of reading an image previously stored in the liquid crystal optical modulation layer of the device of claim 1, comprising the step of transmitting a polarized optical beam through the optical modulation layer so that the emergent beam is detected by the detector layer after being analyzed by the absorbing means.

24. A device according to claim 1, wherein the device comprises an optical element cooperating with the optical modulation layer and the absorbing means to convert spatial changes in optical information to a corresponding intensity pattern at the detector layer.

25. A device according to claim 24, wherein the optical element is an optical color filter.

26. A device according to claim 24, wherein the optical element is an optical interferometer.

27. A device according to claim 24, wherein the optical element comprises a retardation element and a polarizer.

28. A device according to claim 24, wherein the optical element comprises a micro-optic array for spatially sampling an optical phase front.

29. An integrated electro-optical device comprising a liquid crystal optical modulation layer, an opto-electronic detector layer, and means for absorbing polarized light superimposed over the detector layer, the absorbing means forming an integral polarization analyzer and the detector layer being arranged to detect a result of optical processing by the optical modulation layer via the absorbing means and further comprising a photoconductor disposed between the opto-electronic detector layer and the optical modulation layer.

30. A device according to claim 29, wherein the device comprises means for optically presenting an image to the photoconductor and means for applying a voltage across the optical modulation layer so as to cause a thresholded version of the image to be stored in the optical modulation layer.

31. An integrated electro-optical device comprising a liquid crystal optical modulation layer, an opto-electronic detector layer, and means for absorbing polarized light superimposed over the detector layer, the absorbing means forming an integral polarization analyze and the detector layer being arranged to detect a result of optical processing by the optical modulation layer via the absorbing means, wherein the detector layer comprises a pixellated opto-electronic detector array and there is a plurality of optical modulation pixels of the optical modulation layer for each detector array pixel of the detector array.

32. An imaging apparatus comprising a device as claimed in claim 31, wherein the apparatus comprises means for addressing the optical modulation pixels of the optical modulation layer as groups, each group consisting of one optical modulation pixel of the plurality for each detector array pixel of the detector array, and electronic control means for selectively making the groups transmissive or absorptive so as to simulate linked optical shutters over all the detector array pixels of the detector array.

33. An apparatus according to claim 32, wherein the apparatus is one of an apparatus for detecting edges in an object and an apparatus for detecting motion of an object by taking a sequence of images of the object, and the apparatus comprises an optical apparatus for imaging the object in the plane of the optical modulation layer.

34. A method of detecting the positions of edges in an object using the apparatus of claim 32, comprising the steps of controlling different groups of pixels of the optical modulation layer to produce in sequence different images of the object spaced in a object plane in accordance with the spacing between the pixels of the plurality of pixels, detecting a first such image, storing that image in another group of pixels, transmitting a second image through the other group of pixels already modulated in accordance with the first image, and reading the emergent light, which is representative of the difference between the first and second images, onto the detector array.

35. A method of detecting motion of an object using an apparatus of claim 32, comprising the steps of controlling different groups of pixels of the optical modulation layer to produce in sequence different images of the object, detecting a first such image, storing that image in another group of pixels, transmitting a second image of the object through the other group of pixels already modulated in accordance with the first image, and reading the emergent light, which is representative of the difference between the first and second images, onto the detector array.

36. A method of reading an image previously stored in a liquid crystal optical modulation layer of an integrated electro-optical device comprising the liquid crystal optical modulation layer, an opto-electronic detection layer, and means for absorbing polarized light superimposed over the detector layer, the absorbing means forming an integral polarization analyzer and the detector layer being arranged to detect a result of optical processing by the optical modulation layer via the absorbing means, comprising the step of transmitting a polarized optical beam through the optical modulation layer so that the emergent beam is detected by the detector layer after being analyzed by the absorbing means wherein the beam is modulated in accordance with a test image before it is transmitted through the optical modulation layer, thereby detecting the difference between the test image and the stored image.

37. A method according to claim 36, wherein the image is stored by optically imaging an object onto the optical modulation layer, detecting it and thereby storing it in the liquid crystal optical modulation layer.

38. A method according to claim 36, wherein the image is stored by electronically storing data representing the image and addressing the optical modulation layer with those data to store the image therein.

* * * * *